US009580801B2

(12) United States Patent
Ba et al.

(10) Patent No.: US 9,580,801 B2
(45) Date of Patent: Feb. 28, 2017

(54) ENHANCING ELECTRICAL PROPERTY AND UV COMPATIBILITY OF ULTRATHIN BLOK BARRIER FILM

(71) Applicant: Applied Materials, Inc., Santa Clara, CA (US)

(72) Inventors: Xiaolan Ba, San Jose, CA (US); Weifeng Ye, San Jose, CA (US); Mei-yee Shek, Palo Alto, CA (US); Yu Jin, Santa Clara, CA (US); Li-Qun Xia, Cupertino, CA (US); Deenesh Padhi, Sunnyvale, CA (US); Alexandros T. Demos, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/535,803

(22) Filed: Nov. 7, 2014

(65) Prior Publication Data
US 2016/0071724 A1 Mar. 10, 2016

Related U.S. Application Data

(60) Provisional application No. 62/045,783, filed on Sep. 4, 2014.

(51) Int. Cl.
| | | |
|---|---|---|
| H01L 21/31 | (2006.01) | |
| C23C 16/44 | (2006.01) | |
| C23C 16/36 | (2006.01) | |
| C23C 16/455 | (2006.01) | |
| C23C 16/50 | (2006.01) | |
| C23C 16/56 | (2006.01) | |
| H01L 21/768 | (2006.01) | |
| H01L 21/02 | (2006.01) | |

(52) U.S. Cl.
CPC .......... *C23C 16/4408* (2013.01); *C23C 16/36* (2013.01); *C23C 16/45523* (2013.01); *C23C 16/50* (2013.01); *C23C 16/56* (2013.01); *H01L 21/76826* (2013.01); *H01L 21/76832* (2013.01); *H01L 21/76834* (2013.01); *H01L 21/02167* (2013.01)

(58) Field of Classification Search
CPC .................... H01L 21/02167; H01L 21/76834
USPC ................... 438/784; 257/E21.627, E21.628
See application file for complete search history.

(56) References Cited

U.S. PATENT DOCUMENTS

2013/0078376 A1* 3/2013 Higashino ............... C23C 16/34
427/255.39
2014/0342573 A1* 11/2014 Hirose .................... C23C 16/36
438/761

* cited by examiner

*Primary Examiner* — Chandra Chaudhari
(74) *Attorney, Agent, or Firm* — Patterson + Sheridan, LLP

(57) ABSTRACT

Embodiments described herein generally relate to the formation of a UV compatible barrier stack. Methods described herein can include delivering a process gas to a substrate positioned in a process chamber. The process gas can be activated to form an activated process gas, the activated process gas forming a barrier layer on a surface of the substrate, the barrier layer comprising silicon, carbon and nitrogen. The activated process gas can then be purged from the process chamber. An activated nitrogen-containing gas can be delivered to the barrier layer, the activated nitrogen-containing gas having a $N_2$:$NH_3$ ratio of greater than about 1:1. The activated nitrogen-containing gas can then be purged from the process chamber. The above elements can be performed one or more times to deposit the barrier stack.

19 Claims, 3 Drawing Sheets

ENHANCING ELECTRICAL PROPERTY AND UV COMPATIBILITY OF ULTRATHIN BLOK BARRIER FILM

CROSS-REFERENCE TO RELATED APPLICATIONS

This application claims benefit of U.S. Provisional Patent Application Ser. No. 62/045,783, filed Sep. 4, 2013, which is herein incorporated by reference.

BACKGROUND

Field

Embodiments of the invention generally relate to semiconductor manufacturing. More specifically, embodiments disclosed herein are related to barrier layers between dissimilar materials.

Description of the Related Art

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. Another method of depositing metal and dielectric films at relatively low temperatures is plasma-enhanced CVD (PECVD) techniques. PECVD techniques promote excitation and/or disassociation of the reactant gases by the application of energy, such as radio frequency (RF) energy, to a reaction zone near the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.25 µm feature sizes, and tomorrow's plants soon will be producing devices having even smaller geometries.

In order to further reduce the size of devices on integrated circuits, it has become necessary to use conductive materials having low resistivity and insulators having low k (dielectric constant<2.5) to reduce the capacitive coupling between adjacent metal lines. Liner/barrier layers have been used between the conductive materials and the insulators to prevent diffusion of byproducts such as moisture onto the conductive material. For example, moisture that can be generated during formation of a low k insulator readily diffuses to the surface of the conductive metal and increases the resistivity of the conductive metal surface. A barrier/liner layer formed from organosilicon or organosilane nitride materials can block the diffusion of the byproducts.

As geometries of device have continued to scale down, the need for device speed, characterized by RC delay, is significantly affected by the effective dielectric constant ($k_{effective}$) of the ultra-low k dielectric film combined with a copper diffusion dielectric barrier film (also known as a dielectric barrier layer). The dielectric barrier layer should have either a lower k value or a reduced thickness to help to reduce the $k_{effective}$. However, current barrier layers have minimum thickness requirements to overcome difficulties created by other processing steps. For example, UV irradiation used in the process of producing porous ultra-low k dielectric film (e.g., low k insulators) can induce great stress change and degradation of electrical property. The UV radiation creates pores while simultaneously shrinking the barrier layer, which induces a stress change and creates a degradation of electrical properties.

Therefore, ultra-thin low k Cu barrier films with UV compatibility and good conformality are needed.

SUMMARY

Embodiments described herein generally provide method of forming a barrier layer or a barrier stack. By cyclically depositing a thin carbon-silicon-nitrogen layer followed by purge using an inert gas and a nitrogen-containing plasma treatment, a barrier stack can be formed with improved density, improved hermeticity and lower stress than standard barrier layers. The desired thickness can be achieved by depositing multiple layers.

In one embodiment, a method of depositing a barrier layer is disclosed. The method can include delivering a process gas to a substrate positioned in a process chamber; activating the process gas to form an activated process gas, the activated process gas forming a barrier layer on a first surface of the substrate, the barrier layer comprising silicon, carbon and nitrogen; purging the activated process gas from the process chamber; delivering an activated nitrogen-containing gas to the barrier layer, the activated nitrogen-containing gas having a $N_2$:$NH_3$ ratio of greater than about 1:1; and purging the activated nitrogen-containing gas from the process chamber.

In another embodiment, a method of depositing a barrier layer is disclosed. The method can include positioning a substrate in a process chamber; forming a barrier layer; and repeating the formation of the barrier layer one or more times. The forming of the barrier layer can include delivering a process gas to the substrate; forming a plasma including the process gas to form an activated process gas, wherein the activated process gas forms a barrier layer on a first surface of the substrate, the barrier layer comprising silicon, carbon and nitrogen; purging the activated process gas from the process chamber; delivering an activated nitrogen-containing gas to the barrier layer to form a cured barrier layer, the activated nitrogen-containing gas having a $N_2$:$NH_3$ ratio of greater than about 1:1, wherein the resulting barrier layer is between about 5 Å and about 30 Å thick; and purging the activated nitrogen-containing gas from the process chamber.

In another embodiment a method of depositing a barrier layer is disclosed. The method can include positioning a substrate in a process chamber; forming a barrier layer; and repeating the formation of the barrier layer one or more times to achieve a thickness of at least about 40 Å. The forming of the barrier layer can include delivering a process gas to the substrate, the process gas comprising trimethylsilane (TMS), bis(diethylamino)silane (BDEAS), hexamethylcyclotrisilazane (HMCTZ), or combinations thereof; forming an RF plasma including the process gas to form an activated process gas, wherein the activated process gas forms a barrier layer on a first surface of the substrate, the barrier layer comprising silicon, carbon and nitrogen; purging the activated process gas from the process chamber using an inert gas; forming an RF plasma including a nitrogen-containing gas to create an activated nitrogen-containing gas; delivering the activated nitrogen-containing gas to the barrier layer to form a cured barrier layer, the activated nitrogen-containing gas having a $N_2$:$NH_3$ ratio of greater than about 10:1, wherein the resulting barrier layer is between about 5 Å and about 30 Å thick; and purging the activated nitrogen-containing gas from the process chamber using an inert gas.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, common words have been used, where possible, to designate identical elements that are common to the figures. It is contemplated that elements disclosed in one embodiment may be beneficially utilized on other embodiments without specific recitation.

DETAILED DESCRIPTION

Embodiments described herein generally provide method of forming a barrier layers or stacks. The cyclic barrier layer can be deposited by forming thin barrier layer using an activated deposition gas, purging the chamber of the activated deposition gas and by-products, plasma treatment using high Ar/N2 and low NH3 flow, and purging the chamber of the plasma treatment precursors and any by-products. Those four steps can be repeated to achieve the desired thickness. By cyclically depositing a thin carbon-silicon-nitrogen layer followed by purge using an inert gas and a nitrogen-containing plasma treatment, a barrier stack can be formed with improved density, improved hermeticity and lower stress than standard barrier layers. The desired thickness can be achieved by depositing multiple layers.

Figure 1:
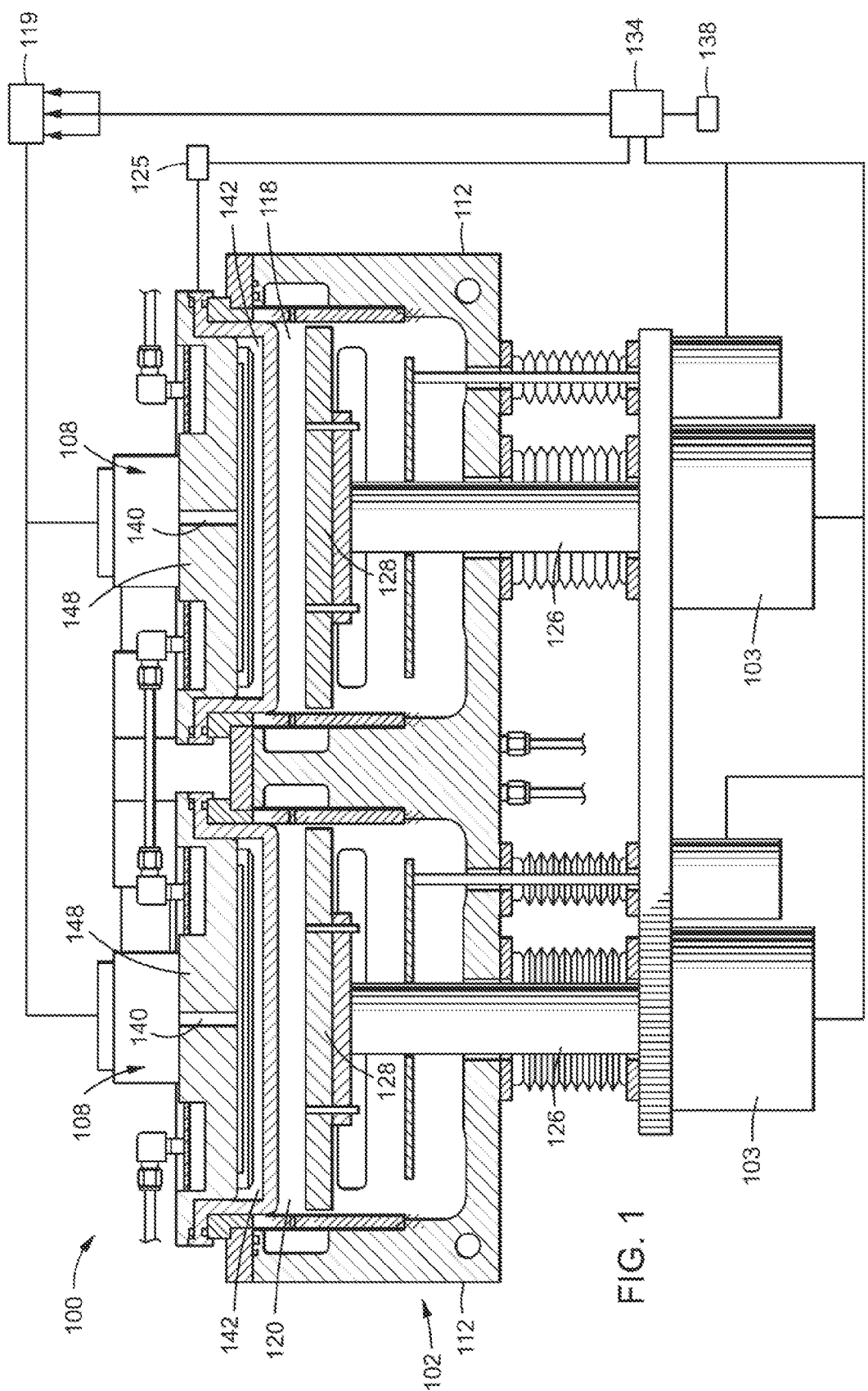
FIG. 1 is a cross sectional schematic diagram of a chemical vapor deposition (CVD) chamber that may be used to perform the methods described herein.

FIG. 1 is a cross sectional schematic diagram of a CVD chamber 100 that may be used for practicing embodiments of the invention. An example of such a chamber is a single or dual chamber on a PRODUCER® system, available from Applied Materials, Inc. of Santa Clara, Calif. The dual chamber has two isolated processing regions (for processing two substrates, one substrate per processing region) such that the flow rates experienced in each region are approximately one half of the flow rates into the whole chamber. The flow rates described in the examples below and throughout the specification are the flow rates per 300 mm substrate.

The CVD chamber 100 has a chamber body 102 that defines separate processing regions 118, 120. Each processing region 118, 120 has a pedestal 128 for supporting a substrate (not shown) within the CVD chamber 100. Each pedestal 128 typically includes a heating element (not shown). In one embodiment, each pedestal 128 is movably disposed in one of the processing regions 118, 120 by a stem 126 which extends through the bottom of the chamber body 102 where it is connected to a drive system 103.

Each of the processing regions 118, 120 may include a gas distribution assembly 108 disposed through a chamber lid to deliver gases into the processing regions 118, 120. The gas distribution assembly 108 of each processing region normally includes a gas inlet passage 140, which delivers gas from a gas flow controller 119 into a gas distribution manifold 142, which is also known as a showerhead assembly. Gas flow controller 119 is typically used to control and regulate the flow rates of different process gases into the chamber. Other flow control components may include a liquid flow injection valve and liquid flow controller (not shown) if liquid precursors are used. The gas distribution manifold 142 comprises an annular base plate 148, a face plate 146, and a blocker plate 144 between the base plate 148 and the face plate 146. The gas distribution manifold 142 includes a plurality of nozzles (not shown) through which gaseous mixtures are injected during processing. A radio frequency (RF) source 125 provides a bias potential to the gas distribution manifold 142 to facilitate generation of a plasma between the showerhead assembly 142 and the pedestal 128. During a plasma-enhanced chemical vapor deposition (PECVD) process, the pedestal 128 may serve as a cathode for generating the RF bias within the chamber body 102. The cathode is electrically coupled to an electrode power supply to generate a capacitive electric field in the chamber 100. Typically an RF voltage is applied to the cathode while the chamber body 102 is electrically grounded. Power applied to the pedestal 128 creates a substrate bias in the form of a negative voltage on the upper surface of the substrate. This negative voltage is used to attract ions from the plasma formed in the chamber 100 to the upper surface of the substrate.

During processing, process gases are uniformly distributed radially across the substrate surface. The plasma is formed from one or more process gases or a gas mixture by applying RF energy from the RF power supply 125 to the gas distribution manifold 142, which acts as a powered electrode. Film deposition takes place when the substrate is exposed to the plasma and the reactive gases provided therein. The chamber walls 112 are typically grounded. The RF power supply 125 can supply either a single or mixed-frequency RF signal to the gas distribution manifold 142 to enhance the decomposition of any gases introduced into the processing regions 118, 120.

A system controller 134 controls the functions of various components such as the RF power supply 125, the drive system 103, the lift mechanism, the gas flow controller 119, and other associated chamber and/or processing functions. The system controller 134 executes system control software stored in a memory 138, which in the preferred embodiment is a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes, and other plasma process chambers may also be employed for practicing embodiments described herein. Further, though the chamber described above described the formation of plasma using an RF source, this is not meant to exclude other sources of plasma, including microwave plasma.

Figure 2:
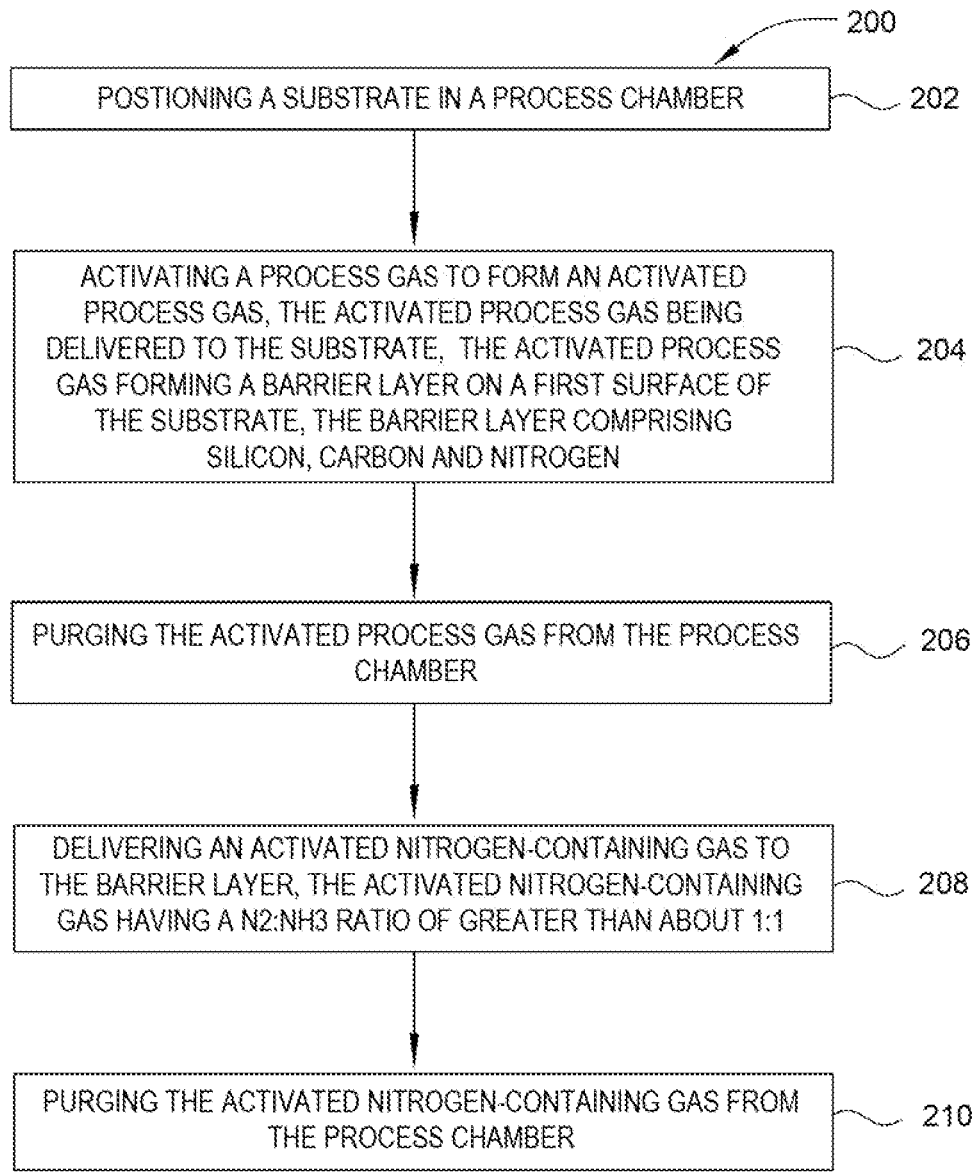
FIG. 2 depicts a flow diagram illustrating a method according to an embodiment described herein.

FIG. 2 is a flow diagram of a method 200 according to an embodiment of the invention. FIGS. 3A-3D illustrate schematic cross sectional views of a substrate during different stages of the method 200 of FIG. 2. The method 200 starts at 202 by positioning a substrate 300 in a process chamber, the substrate 300 shown in FIG. 3A. The substrate 300 may be, among others, a thin sheet of metal, plastic, organic material, silicon, glass, quartz, or polymer materials. In one embodiment, the substrate 300 is a glass substrate upon which a silicon-containing dielectric is deposited. In other embodiments, the substrate 300 may be doped or otherwise modified glass substrate. The substrate 300 may be circular, square or other shapes as known in the art.

The substrate 300 can have a dielectric layer 302 disposed over the substrate surface 301. Conductive contacts 304 are disposed within the dielectric layer 302 and are separated from the dielectric layer 302 by barrier layers 306. The dielectric layer 302 contains a dielectric material, such as a low-k dielectric material. In one example, the dielectric layer 302 contains a low-k dielectric material, such as a silicon carbide oxide material or a carbon doped silicon oxide material, for example, BLACK DIAMOND® II low-k dielectric material, available from Applied Materials, Inc., located in Santa Clara, Calif.

The feature barrier layer 306 may be conformally deposited into the feature within the dielectric layer 302. The feature barrier layer 306 may be formed or deposited by a physical vapor deposition (PVD) process, an atomic layer deposition (ALD) process, or a CVD process, and may have a thickness within a range from about 5 Å to about 50 Å, such as from about 10 Å to about 30 °. The feature barrier layer 306 may contain titanium, titanium nitride, tantalum, tantalum nitride, tungsten, tungsten nitride, silicides thereof, derivatives thereof, or combinations thereof. In some embodiments, the feature barrier layer 306 may contain a tantalum/tantalum nitride bilayer or titanium/titanium nitride bilayer. In one example, the feature barrier layer 306 contains tantalum nitride and metallic tantalum layers deposited by PVD processes. The conductive contacts 304 may be a metal, such as copper.

With the substrate positioned in the process chamber, a process gas is activated to form an activated process gas, the activated process gas being delivered to the substrate and forming a barrier layer on a first surface of the substrate, at 204.

The process gas can include a silicon containing compound. The silicon containing compound may be a carbon-containing silicon compound, including organosilicon compounds described herein, for example, methylsilane ($CH_3SiH_3$), trimethylsilane (TMS), bis(diethylamino)silane (BDEAS), hexamethylcyclotrisilazane (HMCTZ), derivatives thereof, and combinations thereof. Dopants, such as nitrogen containing dopants, for example, $NH_3$, may be used with the silicon based compounds as described herein. Additionally, an inert gas, such as nitrogen or a noble gas including helium and argon, may be used during the deposition process, and may be used as a carrier gas for the thermal process or as an additional plasma species for the plasma enhanced silicide formation process. The silicon based compound may further include a dopant, such as the reducing compound described herein.

In one embodiment, the method described herein includes providing silicon containing compounds to a process chamber at a flow rate between about 10 sccm and about 1,000 sccm, such as between about 20 sccm and about 400 sccm. Optionally, an inert gas, such as helium, argon, or nitrogen, may also by supplied to a process chamber at a flow rate between about 100 sccm and about 20,000 sccm, such as between about 2,000 sccm and about 19,000 sccm. The process chamber pressure may be maintained between about 0.5 Torr and about 12 Torr, such as between about 2 Torr and about 9 Torr. The heater temperature may be maintained between about 100° C. and about 500° C., such as between about 250° C. and about 450° C. The gas distributor or "showerhead" may be positioned between about 200 mils and about 1000 mils, such as between 200 mils and 600 mils from the surface of the substrate 300.

The process gas may be activated by a plasma to create the activated process gas. This may include forming a plasma either in the process region of the process chamber or forming the plasma remotely. Further, the process gas may be formed into a plasma or may be activated by a second gas that is formed into a plasma prior to being delivered to the process gas. The second gas may be an inert gas. The process chamber may produce an in-situ plasma or be equipped with a remote plasma source (RPS). The activated gas will form a barrier layer 310 over a first surface 308 of the dielectric layer 302, shown in FIG. 3B. The barrier layer 310 can be between about 10 Å and about 100 Å thick, such as between about 20 Å and about 50 Å thick. In one example, the barrier layer 310 is 20 Å thick. The barrier layer 310 can include silicon, carbon and nitrogen.

The activated process gas can then be purged from the process chamber, at 206. The purge can include delivering an inert gas to the process chamber. The inert gas can be a gas which is non-reactive or minimally reactive with relation to the deposited layer and the activated process gas, such as argon, helium, diatomic nitrogen or others. The inert gas can be delivered at a flow rate of between 100 sccm and 10000 sccm, such as a flow rate of 5000 sccm. The purge can be maintained until the chamber is free of process gas, activated process gas, and byproducts of the deposition of the barrier layer 310.

Figure 3A:
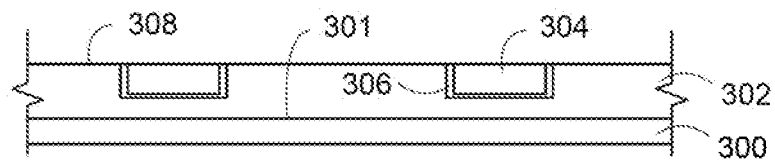
FIGS. 3A-3D depict schematic cross sectional views of a substrate at different process steps according to an embodiment described herein.
Figure 3B:
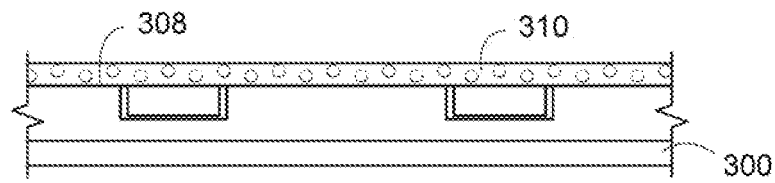
Figure 3C:
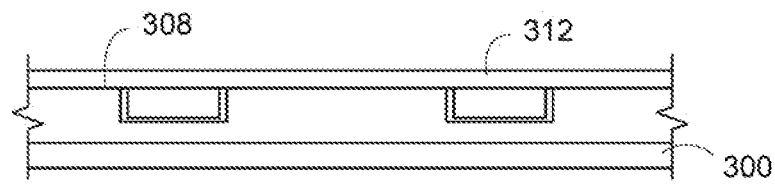
Figure 3D:
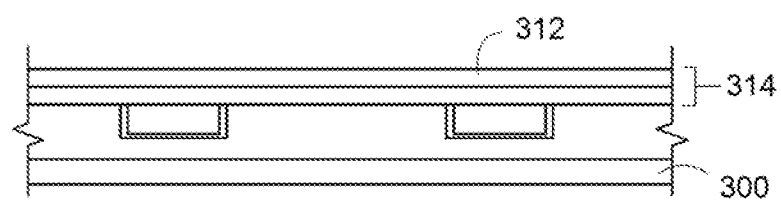

Once the chamber has been purged an activated nitrogen containing gas can be delivered to the barrier layer, at 208. The activated nitrogen containing gas can include at least a nitrogen source gas and an inert gas. In one embodiment, the nitrogen source gas comprises $N_2$ and $NH_3$. The $N_2$ and $NH_3$ may be at a ratio where the $N_2$ concentration is greater than the $NH_3$ concentration. In one embodiment, the $N_2:NH_3$ ratio is greater than 1:1, such as greater than 10:1. In one example, the $N_2:NH_3$ ratio is at least 100:1. In another embodiment, the barrier layer 310 is exposed to a plasma process to cure the barrier layer 310, creating the first cured barrier layer 312, as shown in FIG. 3C. The substrate 300 is positioned within a process chamber, where the process chamber may produce an in-situ plasma or be equipped with a remote plasma source (RPS). In one embodiment, the substrate 300 may be exposed to the plasma (e.g., in situ or remotely) for a time period within a range from about 2 seconds to about 60 seconds, such as from about 3 seconds to about 10 seconds. In one embodiment, the time period ranges from about 5 seconds to about 20 seconds. The plasma may be produced at a power within the range from about 200 watts to about 1,000 watts, such as from about 400 watts to about 800 watts. In one example, the substrate 300 may be exposed to $N_2$, $NH_3$ and Ar gas, while a plasma is generated at about 200 watts for about 10 seconds at about 2 Torr. In another example, the substrate 300 may be exposed to $N_2$, and $NH_3$ gas while a plasma is generated at 300 watts for about 5 seconds at about 3 Torr.

The activated nitrogen-containing gas can then be purged from the process chamber, at 210. The purge can include delivering an inert gas to the process chamber, as described above with reference to 206. The inert gas can be a gas which is non-reactive or minimally reactive with relation to the deposited layer and the activated process gas, such as argon, helium, diatomic nitrogen or others. The inert gas can be delivered at a flow rate of between 100 sccm and 10000 sccm, such as a flow rate of 5000 sccm. The purge can be maintained until the chamber is free of nitrogen-containing gas, activated nitrogen-containing gas, and byproducts of the formation of the cured barrier layer 312.

Once the cured barrier layer 312 is formed, the deposition, purge, treatment and purge elements described of the method 200 described above may be repeated one or more times to form a barrier stack 314. Through the use of the method described above to deposit a barrier stack, the stress of the film is more stable than bulk film or cyclic deposition film without any treatment. Further, the stress levels of the new barrier stack is significantly less sensitive to UV exposure, where the stress changes upon standard UV exposure by less than 200 MPa at 350 degrees Celsius.

Further, the hermeticity, or moisture diffusion barrier property, of the barrier stack is improved over bulk deposited barrier layers. In one example, 40 Å of barrier stack (approximately 2 deposition cycles at 20 Å each) is sufficient to resist moisture penetration as compared to 100 Å for a standard bulk deposited barrier film and 50 Å for a UV compatible bulk deposited barrier film. Further, oxygen diffusion barrier property of barrier stack described above shows more stability than either of the bulk deposited barrier film under the UV irradiation. $O_2$ concentration in the interface shows no change while interface $O_2$ concentration of the UV compatible bulk deposited barrier film increases by 100% after UV irradiation.

While the foregoing is directed to embodiments of the present invention, other and further embodiments of the invention may be devised without departing from the basic scope thereof, and the scope thereof is determined by the claims that follow.

The invention claimed is:

1. A method of depositing a barrier layer, comprising:
   positioning a substrate in a process chamber;
   activating a process gas to form a barrier layer on a surface of the substrate, the barrier layer comprising silicon, carbon and nitrogen;
   purging the activated process gas from the process chamber;
   forming an RF plasma including a nitrogen-containing gas to create an activated nitrogen-containing gas;
   delivering the activated nitrogen-containing gas to the barrier layer, the activated nitrogen-containing gas having a $N_2:NH_3$ ratio of greater than about 1:1, wherein the nitrogen-containing gas comprises Ar, $N_2$, and $NH_3$; and
   purging the activated nitrogen-containing gas from the process chamber.

2. The method of claim 1, wherein the $N_2:NH_3$ ratio of the activated nitrogen-containing gas is greater than about 10:1.

3. The method of claim 1, wherein the $N_2:NH_3$ ratio of the activated nitrogen-containing gas is about 100:1.

4. The method of claim 1, wherein the $N_2$ concentration of the activated nitrogen-containing gas is approximately equal to the Ar concentration of the activated nitrogen-containing gas.

5. The method of claim 1, wherein the process gas comprises bis(diethylamino) silane (BDEAS), hexamethylcyclotrisilazane (HMCTZ), trimethylsilane (TMS) or combinations thereof.

6. The method of claim 1, wherein the activated nitrogen-containing gas is delivered for a time period of between about 5 seconds and about 20 seconds.

7. The method of claim 1, wherein the process gas comprises a carbon-silicon precursor with a $Si:CH_3$ ratio of less than about 3:1.

8. A method of depositing a barrier layer, comprising:
   positioning a substrate in a process chamber;
   forming a barrier layer, comprising:
      delivering a process gas to the substrate;
      forming a plasma including the process gas to form an activated process gas, wherein the activated process gas forms a barrier layer on a first surface of the substrate, the barrier layer comprising silicon, carbon and nitrogen;
      purging the activated process gas from the process chamber;
      forming an RF plasma including a nitrogen-containing gas to create an activated nitrogen-containing gas;
      delivering the activated nitrogen-containing gas to the barrier layer to form a cured barrier layer, the activated nitrogen-containing gas having a $N_2:NH_3$ ratio of greater than about 1:1, wherein the resulting barrier layer is between about 5 Å and about 30 Å thick and the nitrogen-containing gas comprises Ar, $N_2$, and $NH_3$; and
      purging the activated nitrogen-containing gas from the process chamber; and
   repeating the formation of the barrier layer one or more times to form a barrier stack.

9. The method of claim 8, wherein the $N_2:NH_3$ ratio of the activated nitrogen-containing gas is greater than about 10:1.

10. The method of claim 8, wherein the $N_2:NH_3$ ratio of the activated nitrogen-containing gas is about 100:1.

11. The method of claim 8, wherein the $N_2$ concentration of the activated nitrogen-containing gas is approximately equal to the Ar concentration of the activated nitrogen-containing gas.

12. The method of claim 8, wherein the process gas comprises bis(diethylamino) silane (BDEAS), hexamethylcyclotrisilazane (HMCTZ), trimethylsilane (TMS) or combinations thereof.

13. The method of claim 8, wherein the activated nitrogen-containing gas is delivered for a time period of between about 5 seconds and about 20 seconds.

14. The method of claim 8, wherein the process gas comprises a carbon-silicon precursor with a $Si:CH_3$ ratio of less than about 3:1.

15. A method of depositing a barrier layer, comprising:
   positioning a substrate in a process chamber;
   forming a barrier layer, comprising:
      delivering a process gas to the substrate, the process gas comprising bis(diethylamino) silane (BDEAS), hexamethylcyclotrisilazane (HMCTZ), trimethylsilane (TMS) or combinations thereof;
      forming an RF plasma including the process gas to form an activated process gas, wherein the activated process gas forms a barrier layer on a surface of the substrate, the barrier layer comprising silicon, carbon and nitrogen;
      purging the activated process gas from the process chamber using an inert gas;
      forming an RF plasma including a nitrogen-containing gas to create an activated nitrogen-containing gas;
      delivering the activated nitrogen-containing gas to the barrier layer to form a cured barrier layer, the activated nitrogen-containing gas having a $N_2:NH_3$ ratio of greater than about 10:1, wherein the resulting barrier layer is between about 5 Å and about 30 Å thick and the nitrogen-containing gas comprises Ar, $N_2$, and $NH_3$; and purging the activated nitrogen-containing gas from the process chamber using an inert gas; and repeating the formation of the barrier layer one or more times to form a barrier stack, the barrier stack having a thickness of at least about 40 Å.

16. The method of claim 15, wherein the $N_2$:$NH_3$ ratio of the activated nitrogen-containing gas is about 100:1.

17. The method of claim 15, wherein the $N_2$ concentration of the activated nitrogen-containing gas is approximately equal to the Ar concentration of the activated nitrogen-containing gas.

18. The method of claim 15, wherein the activated nitrogen-containing gas is delivered for a time period of between about 5 seconds and about 20 seconds.

19. The method of claim 1, wherein activating the process gas to form the barrier layer on the surface of the substrate comprises forming an RF plasma including the process gas to form an activated process gas, wherein the activated process gas forms the barrier layer on the surface of the substrate.

* * * * *

UNITED STATES PATENT AND TRADEMARK OFFICE
CERTIFICATE OF CORRECTION

PATENT NO. : 9,580,801 B2  
APPLICATION NO. : 14/535803  
DATED : February 28, 2017  
INVENTOR(S) : Xiaolan Ba et al.

It is certified that error appears in the above-identified patent and that said Letters Patent is hereby corrected as shown below:

On sheet 2 of 3, in Figure 2, reference numeral 202, Line 1, delete "POSTIONING" and insert -- POSITIONING --, therefor.

In Column 1, Line 9, delete "Sep. 4, 2013," and insert -- Sep. 4, 2014, --, therefor.

In Column 5, Line 28, delete "30 °." and insert -- 30 Å. --, therefor.

Signed and Sealed this  
Second Day of May, 2017

Michelle K. Lee  
*Director of the United States Patent and Trademark Office*